(12) United States Patent
Huang et al.

(10) Patent No.: US 11,855,593 B2
(45) Date of Patent: Dec. 26, 2023

(54) METHOD FOR ISOLATING TRANSMISSION LINES OF RADIO FREQUENCY POWER AMPLIFIER AND TRANSMISSION STRUCTURE FOR RADIO FREQUENCY POWER AMPLIFIER

(71) Applicant: LANSUS TECHNOLOGIES INC., Shenzhen (CN)

(72) Inventors: Huan Huang, Shenzhen (CN); Jiashuai Guo, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 0 days.

(21) Appl. No.: 18/132,425

(22) Filed: Apr. 10, 2023

(65) Prior Publication Data

US 2023/0246608 A1   Aug. 3, 2023

Related U.S. Application Data

(63) Continuation of application No. PCT/CN2022/090601, filed on Apr. 29, 2022.

(30) Foreign Application Priority Data

Jan. 17, 2022   (CN) .......................... 202210053366.X

(51) Int. Cl.
*H03F 3/24*   (2006.01)
*H03F 3/60*   (2006.01)

(52) U.S. Cl.
CPC ................. *H03F 3/24* (2013.01); *H03F 3/60* (2013.01); *H03F 2200/451* (2013.01)

(58) Field of Classification Search
CPC ......... H03F 3/24; H03F 3/60; H03F 2200/451
(Continued)

(56) References Cited

U.S. PATENT DOCUMENTS 6,852,613 B2 * 2/2005 Forbes .............. H01L 23/53209
                                                           257/E21.656
6,900,116 B2 * 5/2005 Forbes .............. H01L 23/53209
                                                           257/E21.656
(Continued)

FOREIGN PATENT DOCUMENTS

CN       1503230 A      6/2004
CN      105742798 A     7/2016
(Continued)

OTHER PUBLICATIONS

Wang et al.,"Permalloy Loaded Transmission Lines for High-Speed Interconnect Applications", IEEE Transactions on Electron Devices, vol. 51, No. 1, Jan. 2004, pp. 74-82 (Year: 2004).*

*Primary Examiner* — Hafizur Rahman

(57) ABSTRACT

A method for isolating transmission lines of a radio frequency power amplifier and a transmission structure of the radio frequency power amplifier are provided. The method includes steps of setting a distance between adjacent two of transmission lines on a chip substrate to be greater than 2.5 times a width of each of the transmission lines, and disposing shielding lines at an inner side of each of the transmission lines and an outer side of each of the transmission lines opposite to the inner side; wrapping a permalloy layer on an outer wall of each of the transmission lines; and wrapping an aluminum layer on an outer wall of the permalloy layer, defining a plurality of grooves on an outer wall of the aluminum layer at intervals, where the plurality of the grooves are recessed inward and in an inverted triangular structure.

11 Claims, 3 Drawing Sheets

(58) Field of Classification Search
USPC .............................................. 330/2
See application file for complete search history.

(56) References Cited

U.S. PATENT DOCUMENTS

| | | | |
|---|---|---|---|
| 6,903,444 B2 * | 6/2005 | Forbes | H01L 23/53209 |
| | | | 257/664 |
| 6,906,402 B2 * | 6/2005 | Forbes | H01L 23/53209 |
| | | | 257/E21.656 |
| 6,914,278 B2 * | 7/2005 | Forbes | H01L 23/53209 |
| | | | 257/225 |
| 7,304,555 B2 * | 12/2007 | Wang | H01P 3/08 |
| | | | 333/238 |
| 2005/0212627 A1 | 9/2005 | Wang et al. | |
| 2014/0139300 A1 | 5/2014 | Brown et al. | |
| 2019/0304622 A1 | 10/2019 | Lee et al. | |

FOREIGN PATENT DOCUMENTS

| | | |
|---|---|---|
| CN | 108183016 A | 6/2018 |
| JP | 2006101240 A * | 4/2006 |

* cited by examiner

METHOD FOR ISOLATING TRANSMISSION LINES OF RADIO FREQUENCY POWER AMPLIFIER AND TRANSMISSION STRUCTURE FOR RADIO FREQUENCY POWER AMPLIFIER

TECHNICAL FIELD

The present disclosure relates to a technical field of wireless communications, and in particular to a method for isolating transmission lines of a radio frequency power amplifier and a transmission structure for the radio frequency power amplifier.

BACKGROUND

Wireless communications refer to long-distance communications which are performed without conductors or cables for transmitting among a plurality of nodes, and the wireless communications may be performed through radio, wireless, etc. In a process of performing the wireless communications, radio frequency power amplifiers, serving as one important device for communication, mainly play a role in amplifying radio frequency signals, thereby improving communication quality.

However, isolation between transmission lines on a chip substrate of current radio frequency power amplifiers is poor when the radio frequency power amplifiers work in practice, therefore easily causing interference between the transmission lines. Moreover, external electromagnetic waves may also interfere with the transmission lines, thereby causing interference to radio frequency signals transmitted in the transmission lines, and further affecting the communication quality.

SUMMARY

The present disclosure aims to provide a method for isolating transmission lines of a radio frequency power amplifier and a transmission structure for the radio frequency power amplifier to solve a problem that isolation between transmission lines on a chip substrate of current radio frequency power amplifiers is relatively poor, thereby affecting communication quality.

According to a first aspect, the present disclosure provides a method for isolating transmission lines of a radio frequency power amplifier, including:

setting a distance between adjacent two of transmission lines on a chip substrate to be greater than 2.5 times a width of each of the transmission lines, and disposing shielding lines at an inner side of each of the transmission lines and an outer side of each of the transmission lines opposite to the inner side;

wrapping a permalloy layer on an outer wall of each of the transmission lines; and wrapping an aluminum layer on an outer wall of the permalloy layer, defining a plurality of grooves on an outer wall of the aluminum layer at intervals, where the plurality of the grooves are recessed inward and in an inverted triangular structure.

Furthermore, depths of the plurality of the grooves are equal and are smaller than thickness of the aluminum layer, and the plurality of the grooves are disposed on the outer wall of the aluminum layer at equal intervals.

Furthermore, the wrapping the permalloy layer on the outer wall of each of the transmission lines includes following steps:

measuring a length of each of the transmission lines, and serving the length of each of the transmission lines as a length of the permalloy layer;

measuring a perimeter of each of the transmission lines, and serving the perimeter of each of the transmission lines as a width of the permalloy layer;

cutting out the permalloy layer corresponding to each of the transmission lines from a permalloy material according to the length of the permalloy layer and the width of the permalloy layer; and uniformly coating one side of the permalloy layer with an insulation paste, and wrapping and fixing the one side coated with the insulation paste of the permalloy layer on the outer wall of each of the transmission lines.

Furthermore, a material of the insulation paste is 2025DSI, and a thickness of the permalloy layer is 40 μm-50 μm.

Furthermore, the wrapping the permalloy layer on the outer wall of each of the transmission lines further includes a following step:

placing the transmission lines each wrapped and fixed with the permalloy layer in a high-temperature oven to be heated to 150° C. and then taking out the transmission lines each wrapped and fixed with the permalloy layer in the high-temperature oven.

Furthermore, the wrapping the aluminum layer on the outer wall of the permalloy layer includes following steps:

measuring a length of each of the transmission lines, and serving the length of each of the transmission lines as a length of the aluminum layer;

measuring a perimeter of each of the transmission lines, and serving the perimeter of each of the transmission lines as a width of the aluminum layer;

cutting out the aluminum layer corresponding to the permalloy layer from an aluminum material according to the length of the aluminum layer and the width of the aluminum layer; and uniformly coating one side of the aluminum layer with an insulation paste, and wrapping and fixing the one side coated with the insulation paste of the aluminum layer on the outer wall of the permalloy layer.

Furthermore, a material of the insulation paste is 2025DSI, and a thickness of the aluminum layer is 35 μm-45 μm.

Furthermore, the wrapping the aluminum layer on the outer wall of the permalloy layer further includes a following step:

placing the transmission lines each wrapped and fixed with the aluminum layer in a high-temperature oven to be heated to 150° C. and then taking out the transmission lines each wrapped and fixed with the aluminum layer in the high-temperature oven.

Furthermore, a depth of each of the plurality of the grooves is 20 μm-25 μm, and a distance between adjacent two of the plurality of the grooves is 0.5 mm-0.8 mm.

Furthermore, the shielding lines are made of an insulation material, a width of each of the shielding lines is 50 μm-65 μm, and a length of each of the shielding lines is greater than or equal to a length of each of the transmission lines.

According to a second aspect, the present disclosure further provides a transmission structure for a radio frequency power amplifier, including a chip substrate and at least two transmission lines. The at least two transmission lines are disposed on the chip substrate. A distance between adjacent two of the at least two transmission lines is greater than 2.5 times a width of each of the at least two transmission lines. Shielding lines are disposed at an inner side of each of the at least two transmission lines and an outer side of each of the at least two transmission lines opposite to the inner side. A permalloy layer is wrapped on an outer wall of each of the at least two transmission lines, an aluminum layer is wrapped on an outer wall of the permalloy layer, and a plurality of grooves are defined on an outer wall of the aluminum layer at intervals, where the plurality of the grooves are recessed inward and in an inverted triangular structure.

Compared with the prior art, the method for isolating the transmission lines of the radio frequency power amplifier sets the distance between adjacent two of the transmission lines on the chip substrate to be greater than 2.5 times the width of each of the transmission lines, disposes the shielding lines at the inner side of each of the transmission lines and the outer side of each of the transmission lines opposite to the inner side, wraps the permalloy layer on the outer wall of each of the transmission lines, wraps the aluminum layer on the outer wall of the permalloy layer, and defines the plurality of the grooves on the outer wall of the aluminum layer at intervals, where the plurality of the grooves are recessed inward and in the inverted triangular structure. Therefore, the isolation between the adjacent two of the transmission lines is enhanced and influence on radio frequency signals, transmitted by the transmission lines, by parasitic capacitance between the transmission lines, is reduced, through setting the distance between adjacent two of the transmission lines on the chip substrate and disposing the shielding lines. Moreover, interference to radio frequency signals, transmitted in the transmission lines, by an induced magnetic field existing between the adjacent two of the transmission lines, is avoided through the wrapping of the permalloy layer, which further enhances the isolation between the adjacent two of the transmission lines; and interference to the radio frequency, transmitted in the transmission lines, by external electromagnetic waves, is avoided through the wrapping of the aluminum layer and the disposing of the plurality of the grooves, so as to enhance isolation between the transmission lines and the outside.

BRIEF DESCRIPTION OF DRAWINGS

In order to more clearly illustrate technical solutions in embodiments of the present disclosure, drawings that need to be used in description of the embodiments are briefly described below, and it is obvious that the drawings in the following description are merely some embodiments of the present disclosure, and those skilled in the art may obtain other drawings according to these drawings without involving any inventive effort.

Figure 1:
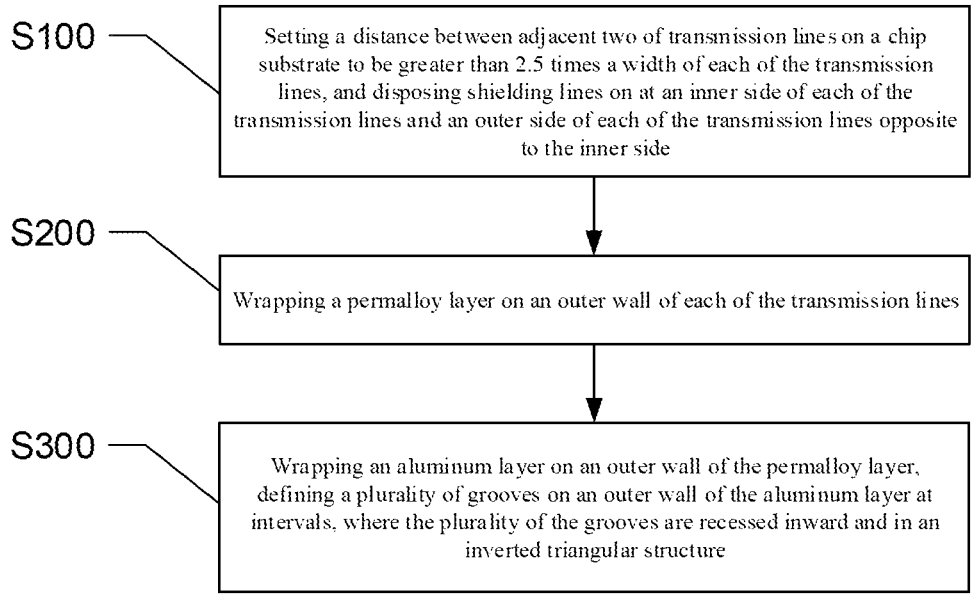
FIG. 1 is a flow diagram of a method for isolating transmission lines of a radio frequency power amplifier according to one embodiment of the present disclosure.

Numerals in the drawings: 1. chip substrate; 2. transmission line; 3. shielding line; 4. permalloy layer; 5. aluminum layer; and 51. groove.

DETAILED DESCRIPTION

Technical solutions in embodiments of the present disclosure are clearly and completely described below, and obviously, the described embodiments are only a part of the embodiments of the present disclosure, but are not all embodiments. All other embodiments obtained by a person of ordinary skill in the art based on the embodiments of the present disclosure without creative efforts shall fall within a protection scope of the present disclosure.

Figure 4:
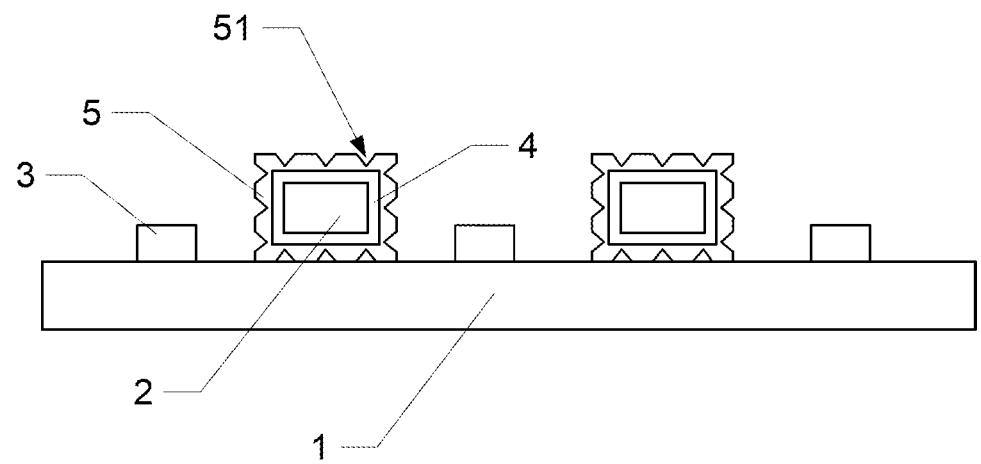
FIG. 4 is a schematic diagram of a transmission structure for the radio frequency power amplifier according to a first embodiment of the present disclosure.

One embodiment of the present disclosure provides a method for isolating transmission lines 2 of a radio frequency power amplifier, as shown in FIGS. 1 and 4, including following steps.

Step S100, setting a distance between adjacent two of transmission lines 2 on a chip substrate 1 to be greater than 2.5 times a width of each of the transmission lines 2, and disposing shielding lines 3 at an inner side of each of the transmission lines 2 and an outer side of each of the transmission lines 2 opposite to the inner side.

If a cross section of each of the transmission lines 2 is a rectangle, a width of each of the transmission lines 2 is a long edge distance of the rectangle; if the cross section of each of the transmission lines 2 is a circle, the width of each of the transmission lines is a diameter of the circle; and if the cross section of each of the transmission lines 2 is in another shape, the width of each of the transmission lines 2 is an average between a distance between two nearest points and a distance between two farthest points of the corresponding shape.

When setting, the distance between the adjacent two of the transmission lines 2 is preset on the chip substrate 1, and when assembling, the transmission lines 2 are disposed according to the distance preset on the chip substrate 1.

Specifically, an increased distance between the adjacent two of the transmission lines 2 is set according to rules of plate-making technology of the chip substrate 1. Furthermore, the distance between the adjacent two of the transmission lines 2 on the chip substrate 1 is equal to 3 times the width (line width) of each of the transmission lines 2.

Specifically, the inner side and the outer side opposite to the inner side of the each of the transmission lines are based on the chip substrate 1.

Specifically, the shielding lines 3 are disposed at the inner side of each of the transmission lines 2 and the outer side of each of the transmission lines 2 opposite to the inner side of the radio frequency power amplifier on the chip substrate 1.

Specifically, according to a layout and a size of the chip substrate 1, the shielding lines may be disposed on an outer wall of each of the transmission lines, or may be disposed at a position, with respect to the inner side and the outer side of each of the transmission lines, of the chip substrate 1.

Specifically, the shielding lines 3 are made of an insulation material, and a length of each of the shielding lines is greater than or equal to a length of each of the transmission lines.

Specifically, a width of each of the shielding lines 3 is 50 μm-65 μm. Certainly, the width of each of the shielding lines 3 may also be adaptively adjusted according to actual requirements.

If a cross section of each of the shielding lines 3 is a rectangle, a width of each of the shielding lines 3 is a long edge distance of the rectangle; if the cross section of each of the shielding lines 3 is a circle, the width of each of the transmission lines is a diameter of the circle; and if the cross section of each of the shielding lines 3 is in another shape, the width of each of the shielding lines 3 is an average between a distance between two nearest points and a distance between two farthest points of the corresponding shape.

Since the distance between the adjacent two of the transmission lines 2 on the chip substrate 1 is set to be greater than 2.5 times the width of each of the transmission lines 2, and the shielding lines 3 are disposed at the inner side of each of the transmission lines 2 and the outer side of each of the transmission lines 2 opposite to the inner side, the adjacent two of the transmission lines may be separated from each other to enhance isolation between the adjacent two of the transmission lines and further reduce influence on radio frequency signals, transmitted by the transmission lines 2, by parasitic capacitance between the transmission lines 2.

Step S200, wrapping a permalloy layer 4 on an outer wall of each of the transmission lines 2.

Specifically, the step S200 wraps the permalloy layer 4 on the outer wall of each of the transmission lines 2, so that outer walls of all of the transmission lines 2 each is wrapped with the permalloy layer 4.

Figure 2:
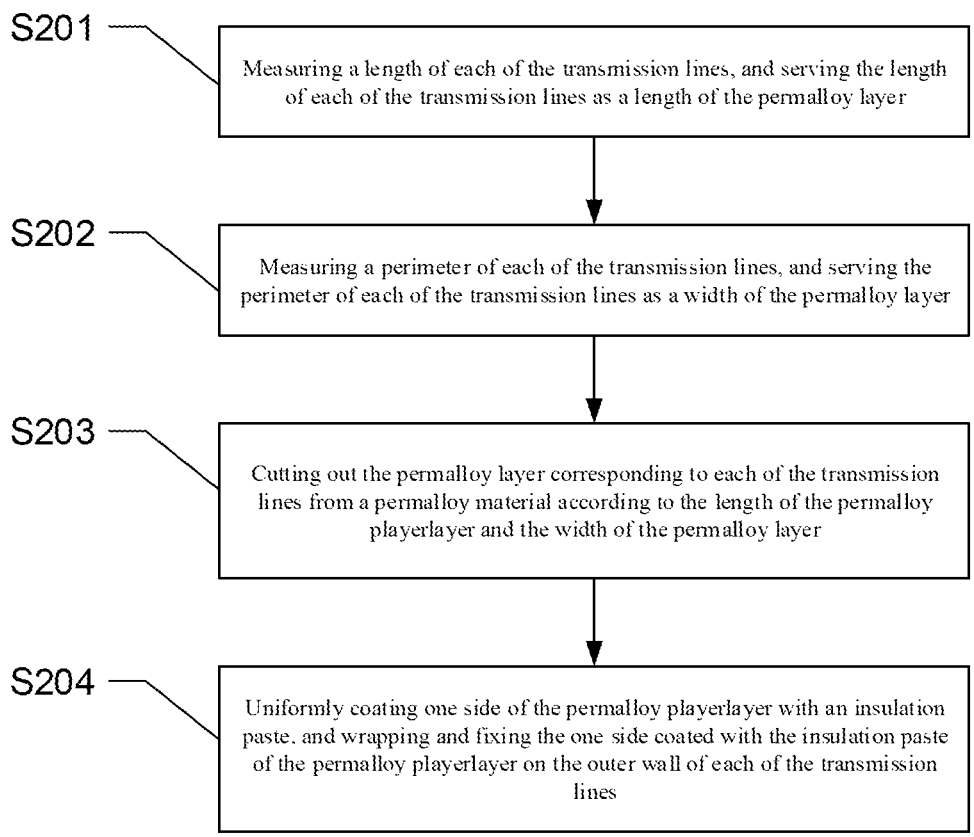
FIG. 2 is a flow diagram of a sub-step in step S200 according to one embodiment of the present disclosure.

Specifically, as shown in FIG. 2, the step S200 includes following sub-steps.

Step S201, measuring a length of each of the transmission lines 2, and serving the length of each of the transmission lines 2 as a length of the permalloy layer 4.

Step S202, measuring a perimeter of each of the transmission lines 2, and serving the perimeter of each of the transmission lines 2 as a width of the permalloy layer 4.

Step S203, cutting out the permalloy layer 4 corresponding to each of the transmission lines 2 from a permalloy material according to the length of the permalloy layer 4 and the width of the permalloy layer 4.

Step S204, uniformly coating one side of the permalloy layer 4 with an insulation paste, and wrapping and fixing the one side coated with the insulation paste of the permalloy layer 4 on the outer wall of each of the transmission lines 2.

Specifically, the steps S201-S204 are steps of wrapping the permalloy layer 4 on an outer wall of a single one of the transmission lines 2.

When measuring the length and the perimeter of each of the transmission lines 2, the length and the perimeter of each of the transmission lines 2 may be obtained through measurement tools, or may be directly obtained according to parameters for manufacturing the chip substrate 1; and when cutting out, a corresponding cutting tool may be used for cutting out.

Specifically, a material of the insulation paste is 2025DSI, and a thickness of the permalloy layer 4 is 40 μm-50 μm. Certainly, according to actual requirements, insulation paste of other materials may also be selected and a thickness of the insulation paste may further be adaptively adjusted.

Specifically, after the step S204, the step S200 further includes a step of placing the transmission lines 2 each wrapped and fixed with the permalloy layer 4 in a high-temperature oven to be heated to 150° C. and then taking out the transmission lines 2 each wrapped and fixed with the permalloy layer 4 in the high-temperature oven. In particular, after heating the transmission lines 2 each wrapped and fixed with the permalloy layer 4 to 150° C., the insulation paste is waited to completely melt, so that the insulation paste may be fully fused with the permalloy layer 4 and each of the transmission lines 2 for being taken out. In this way, stability and firmness of connection between the permalloy layer 4 and each of the transmission lines 2 may be improved.

Specifically, the step of placing the chip substrate 1 in the high-temperature oven to be heated is performed after the step of wrapping the permalloy layer 4 on the outer wall of each of the transmission lines 2.

Since the permalloy layer 4 is made of a high magnetic permeability material, through wrapping the permalloy layer 4 on the outer wall of each of the transmission lines 2, when radio frequency signals pass in the transmission lines to generate an induced magnetic field, so that magnetic induction lines emitted by the induced magnetic field are enabled to move along an outer surface layer of the permalloy layer 4, no induction current is formed in the transmission lines 2, and therefore the radio frequency signals transmitted in the transmission lines 2 may not be interfered, so as to enhance the isolation between the adjacent two of the transmission lines 2.

Step S300, wrapping an aluminum layer 5 on an outer wall of the permalloy layer 4, defining a plurality of grooves 51 on an outer wall of the aluminum layer 5 at intervals, where the plurality of the grooves 51 are recessed inward and in an inverted triangular structure.

Specifically, in the step S300, the permalloy layer 4 is wrapped on the outer wall of each of the transmission lines 2, and is performed until the isolating paste in the step S200 is cooled and solidified.

Specifically, in the step S300, the aluminum layer 5 is wrapped on the outer wall of the permalloy layer 4, so that each of the transmission lines 2 is wrapped with the aluminum layer 5.

Figure 3:
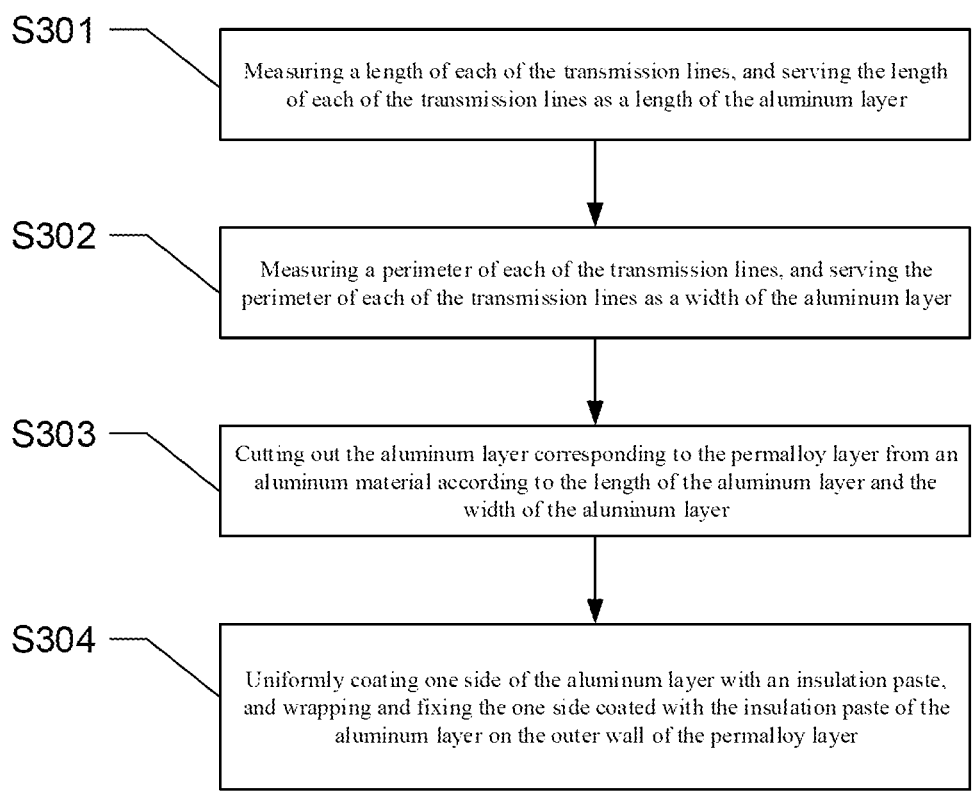
FIG. 3 is a flow diagram of a sub-step in step S300 according to one embodiment of the present disclosure.

Specifically, as shown in FIG. 3, the step S300 includes following sub-steps.

S301, measuring a length of each of the transmission lines 2, and serving the length of each of the transmission lines 2 as a length of the aluminum layer 5.

S302, measuring a perimeter of each of the transmission lines 2, and serving the perimeter of each of the transmission lines 2 as a width of the aluminum layer 5.

S303, cutting out the aluminum layer 5 corresponding to the permalloy layer 4 from an aluminum material according to the length of the aluminum layer 5 and the width of the aluminum layer 5.

S304, uniformly coating one side of the aluminum layer 5 with an insulation paste, and wrapping and fixing the one side coated with the insulation paste of the aluminum layer 5 on the outer wall of the permalloy layer 4.

The steps S301-S304 are steps of wrapping the aluminum layer 5 on an outer wall of a single one of the permalloy layer 4.

The length of each of the transmission lines 2 is measured in the step S201, so that the length of each of the transmission lines 2 may be obtained without measurement, and a perimeter of the permalloy layer 4 is the width of the permalloy layer 4, which is measured in the step S202, and the perimeter of the permalloy layer 4 may be obtained without measurement.

Specifically, a material of the insulation paste is 2025DSI, and a thickness of the permalloy layer 4 is 35 μm-45 μm. Certainly, according to actual requirements, insulation paste of other materials may also be selected and a thickness of the insulation paste may further be adaptively adjusted.

Specifically, the step S300 further includes a step of placing the transmission lines 2 each wrapped and fixed with the aluminum layer 5 in a high-temperature oven to be heated to 150° C. and then taking out the transmission lines 2 each wrapped and fixed with the aluminum layer 5 in the high-temperature oven. After the transmission lines 2 are heated to 150° C. and wait for completely melting the insulation paste, so that the insulation paste is fully fused with the permalloy layer 4 and the aluminum layer 5 and then taken out. In this way, stability and firmness of connection between the permalloy layer 4 and the aluminum layer 5 are improved.

Specifically, the step of placing the chip substrate 1 in the high-temperature oven to be heated is performed after the step of wrapping the aluminum layer 5 on the outer wall of each of the permalloy layer 4.

Specifically, forming the plurality of the grooves 51 is performed after cutting out the aluminum layer 5 in the step S303, and the step S304 is performed after forming the plurality of the grooves 51.

Specifically, depths of the plurality of the grooves 51 are equal and are smaller than thickness of the aluminum layer 5, and the plurality of the grooves 51 are disposed on the outer wall of the aluminum layer 5 at equal intervals.

Specifically, a depth of each of the plurality of the grooves 51 is 20 μm-25 μm, and a distance between adjacent two of the plurality of the grooves 51 is 0.5 mm-0.8 mm.

The aluminum layer 5 is wrapped on the outer wall of the permalloy layer 4, the plurality of the grooves 51 which are recessed inward and in the inverted triangular structure are defined on the outer wall of the aluminum layer 5 at intervals, thereby isolating the external electromagnetic waves through the aluminum layer 5. Meanwhile, when the external electromagnetic waves enter the plurality of the grooves 51 which are recessed inward and in the inverted triangular structure, two inclined surfaces in each of the plurality of the grooves 51 in the inverted triangular structure may reflect electromagnetic waves, so that the electromagnetic waves of the two inclined surfaces cancel each other, and interference on radio frequency signals in the transmission lines 2 by the external electromagnetic waves is avoided, thereby enhancing the isolation between the transmission lines 2 and the outside.

The transmission lines 2 in the embodiment are assembled on the chip substrate 1 after completing steps S100-S300. At this time, the aluminum layer 5 at the outermost layer of the transmission lines is assembled on the chip substrate 1 through bonding, welding, etc.

In addition, when the shielding lines 3 need to be disposed on the chip substrate 1, the step S100 may be performed after completing the step S200 and the step S300. Correspondingly, after the aluminum layer 5 is wrapped around the outer wall of the permalloy layer 4, the permalloy layer 4 is wrapped on each of the transmission lines 2.

Figure 5:
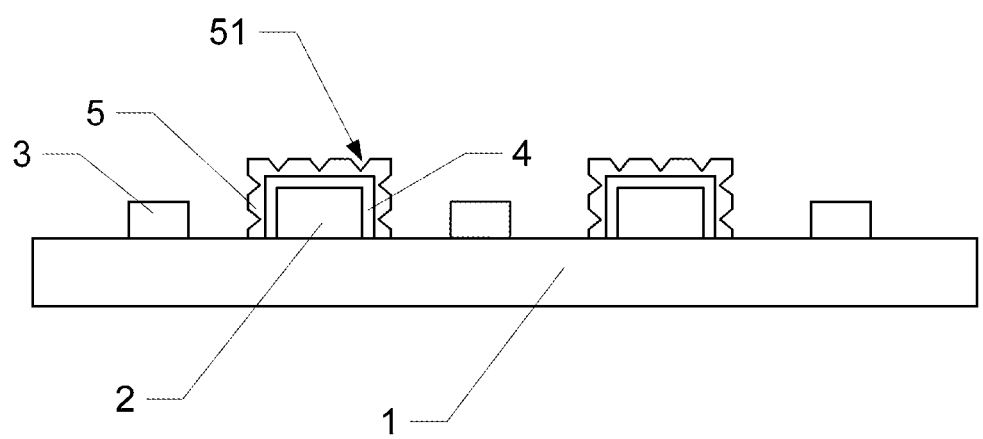
FIG. 5 is a schematic diagram of the transmission structure for the radio frequency power amplifier according to a second embodiment of the present disclosure.

Certainly, according to actual requirements, after the step S100 is completed, as shown in FIG. 5, the transmission lines 2 and the shielding lines 3 are assembled on chip substrate 1, the length of each of the transmission lines is measured to be the length of the permalloy layer 4 and the aluminum layer 5, and the perimeter of a portion of each of the transmission lines 2 that is not in contact with the chip substrate 1 is measured to be the width of the permalloy layer 4, and the permalloy layer 4 is cut out for wrapping. After that, a perimeter of a portion of the permalloy layer 4 that is not in contact with the chip substrate 1 is measured to be the width of the aluminum layer 5, and the aluminum layer 5 is cut out for wrapping, thereby the method for isolating the transmission lines of the radio frequency power amplifier is completed. At this time, only the portions of the outer wall of each of the transmission lines 2 that are not in contact with the chip substrate 1 is sequentially wrapped with the permalloy layer 4 and the aluminum layer 5. Specifically, the transmission lines 2 are assembled on the chip substrate 1 through bonding, welding, etc.

Compared with the prior art, the method for isolating the transmission lines of the radio frequency power amplifier of the present disclosure increases the distance between the adjacent two of the transmission lines 2, provides the shielding lines 3 on two opposite sides of each of the transmission lines 2, wraps the permalloy layer 4 on the outer wall of each of the transmission lines 2, then wraps the aluminum layer 5 on the outer wall of the permalloy layer 4, and provides the plurality of the grooves 51 of the inverted triangular structure on the outer wall of the aluminum layer 5. Therefore, the isolation between the adjacent two of the transmission lines 2 is enhanced through increasing the distance between the adjacent two of the transmission lines 2 and disposing the shielding lines 3, moreover, the influence on the radio frequency signals, transmitted by the transmission lines 2, by the parasitic capacitance between the transmission lines 2 is reduced. Furthermore, interference to the radio frequency signals, transmitted in the transmission lines 2, by an induced magnetic field existing between the adjacent two of the transmission lines 2, is avoided through the wrapping of the permalloy layer 4, which further enhances the isolation between the adjacent two of the transmission lines 2; and interference to the radio frequency, transmitted in the transmission lines 2, by external electromagnetic waves, is avoided through the wrapping of the aluminum layer 4 and the disposing of the plurality of the grooves 5, so as to enhance the isolation between the transmission lines 2 and the outside.

The present disclosure further provides another embodiment, the embodiment provides a transmission structure for the radio frequency power amplifier. As shown in FIG. 4 or 5, including a chip substrate 1 and at least two transmission lines 2. The at least two transmission lines 2 are disposed on the chip substrate 1. A distance between adjacent two of the at least two transmission lines 2 is greater than 2.5 times a width of each of the at least two transmission lines 2. Shielding lines 3 are disposed at an inner side of each of the at least two transmission lines 2 and an outer side of each of the at least two transmission lines 2 opposite to the inner side. A permalloy layer 4 is wrapped on an outer wall of each of the at least two transmission lines 2, an aluminum layer 5 is wrapped on an outer wall of the permalloy layer 4, and a plurality of grooves 51 are defined on an outer wall of the aluminum layer 5 at intervals, where the plurality of the grooves 51 are recessed inward and in an inverted triangular structure.

Furthermore, the distance between the adjacent two of the at least two transmission lines 2 is greater than 3 times the width of each of the at least two transmission lines 2.

The shielding lines 3, the permalloy layer 4, the aluminum layer 5, and the plurality of the grooves 51 on the aluminum layer 5 are all set according to the method for isolating the transmission lines 2 of the radio frequency power amplifier. Therefore, the transmission structure of the radio frequency power amplifier in the embodiment may also achieve the technical effect achieved by the method for isolating the transmission lines 2 of the radio frequency power amplifier in foregoing embodiments.

The above description is merely embodiments of the present disclosure, and is not therefore intended to limit patent scopes of the present disclosure, and any equivalent structure or equivalent process transformation made by using the specification and drawings of the present disclosure, or directly or indirectly applied to other related technical fields, is included within the patent scopes of the present disclosure.

What is claimed is:

1. A method for isolating transmission lines of a radio frequency power amplifier, comprising:
   setting a distance between adjacent two of transmission lines on a chip substrate to be greater than 2.5 times a width of each of the transmission lines, and disposing shielding lines at an inner side of each of the transmission lines and an outer side of each of the transmission lines opposite to the inner side;
   wrapping a permalloy layer on an outer wall of each of the transmission lines; and
   wrapping an aluminum layer on an outer wall of the permalloy layer, defining a plurality of grooves on an outer wall of the aluminum layer at intervals, where the plurality of the grooves are recessed inward and in an inverted triangular structure.

2. The method for isolating the transmission lines of the radio frequency power amplifier according to claim 1, wherein depths of the plurality of the grooves are equal and are smaller than thickness of the aluminum layer, and the plurality of the grooves are disposed on the outer wall of the aluminum layer at equal intervals.

3. The method for isolating the transmission lines of the radio frequency power amplifier according to claim 1, wherein the wrapping the permalloy layer on the outer wall of each of the transmission lines comprises following steps:
   measuring a length of each of the transmission lines, and serving the length of each of the transmission lines as a length of the permalloy layer;
   measuring a perimeter of each of the transmission lines, and serving the perimeter of each of the transmission lines as a width of the permalloy layer;
   cutting out the permalloy layer corresponding to each of the transmission lines from a permalloy material according to the length of the permalloy layer and the width of the permalloy layer; and
   uniformly coating one side of the permalloy layer with an insulation paste, and
   wrapping and fixing the one side coated with the insulation paste of the permalloy layer on the outer wall of each of the transmission lines.

4. The method for isolating the transmission lines of the radio frequency power amplifier according to claim 3, wherein a material of the insulation paste is 2025DSI, and a thickness of the permalloy layer is 40 μm-50 μm.

5. The method for isolating the transmission lines of the radio frequency power amplifier according to claim 3, wherein the wrapping the permalloy layer on the outer wall of each of the transmission lines further comprises a following step:
   placing the transmission lines each wrapped and fixed with the permalloy layer in a high-temperature oven to be heated to 150° C. and then taking out the transmission lines each wrapped and fixed with the permalloy layer in the high-temperature oven.

6. The method for isolating the transmission lines of the radio frequency power amplifier according to claim 1, wherein the wrapping the aluminum layer on the outer wall of the permalloy layer comprises following steps:
   measuring a length of each of the transmission lines, and serving the length of each of the transmission lines as a length of the aluminum layer;
   measuring a perimeter of each of the transmission lines, and serving the perimeter of each of the transmission lines as a width of the aluminum layer;
   cutting out the aluminum layer corresponding to the permalloy layer from an aluminum material according to the length of the aluminum layer and the width of the aluminum layer; and
   uniformly coating one side of the aluminum layer with an insulation paste, and wrapping and fixing the one side coated with the insulation paste of the aluminum layer on the outer wall of the permalloy layer.

7. The method for isolating the transmission lines of the radio frequency power amplifier according to claim 6, wherein a material of the insulation paste is 2025DSI, and a thickness of the aluminum layer is 35 μm-45 μm.

8. The method for isolating the transmission lines of the radio frequency power amplifier according to claim 6, wherein the wrapping the aluminum layer on the outer wall of the permalloy layer further comprises a following step:
   placing the transmission lines each wrapped and fixed with the aluminum layer in a high-temperature oven to be heated to 150° C. and then taking out the transmission lines each wrapped and fixed with the aluminum layer in the high-temperature oven.

9. The method for isolating the transmission lines of the radio frequency power amplifier according to claim 7, wherein a depth of each of the plurality of the grooves is 20 μm-25 μm, and a distance between adjacent two of the plurality of the grooves is 0.5 mm-0.8 mm.

10. The method for isolating the transmission lines of the radio frequency power amplifier according to claim 1, wherein the shielding lines are made of an insulation material, a width of each of the shielding lines is 50 μm-65 μm, and a length of each of the shielding lines is greater than or equal to a length of each of the transmission lines.

11. A transmission structure for a radio frequency power amplifier, comprising:
   a chip substrate; and
   at least two transmission lines;
   wherein the at least two transmission lines are disposed on the chip substrate; a distance between adjacent two of the at least two transmission lines is greater than 2.5 times a width of each of the at least two transmission lines; shielding lines are disposed at an inner side of each of the at least two transmission lines and an outer side of each of the at least two transmission lines opposite to the inner side; a permalloy layer is wrapped on an outer wall of each of the at least two transmission lines; an aluminum layer is wrapped on an outer wall of the permalloy layer, and a plurality of grooves are defined on an outer wall of the aluminum layer at intervals, where the plurality of the grooves are recessed inward and in an inverted triangular structure.

* * * * *